United States Patent [19]
Martin

[11] Patent Number: 6,104,180
[45] Date of Patent: Aug. 15, 2000

[54] TRANSFORMERS OF VOLTAGE METERS BASED ON MECHANICAL WAVES

[76] Inventor: Juan Antonio Talavera Martin, c/ Tomillaron 76, 28230 Las Rozas de Madrid, Spain

[21] Appl. No.: 08/915,611

[22] Filed: Aug. 21, 1997

Related U.S. Application Data

[63] Continuation of application No. 08/426,916, Apr. 21, 1995, abandoned.

[30] Foreign Application Priority Data

May 24, 1994 [ES] Spain .................................. 9401142

[51] Int. Cl.⁷ ............................ G01R 29/24; H01L 41/08
[52] U.S. Cl. ............................................. 324/109; 310/354
[58] Field of Search ..................... 324/109, 228; 310/318, 339, 359, 348, 354; 367/132

[56] References Cited

U.S. PATENT DOCUMENTS

| | | | |
|---|---|---|---|
| 2,172,066 | 9/1939 | Logsdon | 367/132 |
| 4,213,199 | 7/1980 | Labaw et al. | 367/132 |
| 5,159,580 | 10/1992 | Andersen et al. | 367/132 |

*Primary Examiner*—Ernest Karlsen
*Attorney, Agent, or Firm*—Rogers & Killeen

[57] ABSTRACT

Transformers of electric voltage meters based on mechanical waves. The invention is based on the generation of elastic waves in transformers which are composed of a transmitter, a receiver, a dielectric body and a mechanical connection, whereby the transmitter converts the variations in tension in elastic waves, which propagate through the dielectric body to the receiver by means of a connection device, and the receiver converts the mechanical waves in electric signals which are then amplified by means of an electronic unit in order to generate elastic waves from the electric fields from which electric waves are produced; piezoelectric and electrostrictive materials are utilized to build four different types of transformers depending on the structure: monolithic (one-piece), self-connecting, directly-connecting and externally-connecting transformers.

9 Claims, 3 Drawing Sheets

TRANSFORMERS OF VOLTAGE METERS BASED ON MECHANICAL WAVES

This is a continuation of application Ser. No. 08/426,916 filed Apr. 21, 1995, now abandoned.

The following report describes a patent for an invention involving transformers for meters of electric voltage, based on elastic waves, which serve to measure the voltage in alternating-current (ac) electric circuits, on the basis of the generation of elastic (mechanical) waves. The device consists in a transmitter, a receiver, a dielectric body and a mechanical connection.

FIELD OF APPLICATION

This device can be used in industries involved in the manufacture of electric voltage meters.

HISTORY

Electric transformers are devices which are utilized to increase or reduce voltage. Traditionally, this has been accomplished by creating current changes in the magnetic field in the primary circuit which affect the secondary circuit, generating changes in the electric voltage. These phenomena can be explained adequately through the laws of Maxwell.

The ratio between the number of turns in the primary and secondary circuits, determines the ratio between the amplitude of voltage coming in to that which is going out, or the rate of transformation in a vacuum.

When these transformers are utilized as measuring devices, they are not only useful in that they can serve to modify amplitudes, but they are even more interesting given the galvanic insulation they can provide as a result of the fact that the primary and secondary circuits are linked by magnetic fields without any electrical contact.

For all the above explained reasons, transformers are devices which are used universally to measure the voltage in alternating-current electric circuits. However, at the same time as voltage to be measured increases, there is a linear increase in the number of turns and in the insulation of the turns with respect to the ground.

This means that the size (which is the result of the turns ratio and increases exponentially according to the voltage) of the network and substations for electric distribution, ends up being extremely large and disproportionately expensive, considering the power of the signals they are meant to handle.

Added to all this, it is worth noting that the average voltage in electrical networks worldwide is gradually increasing. It is therefore not surprising that there has been a great deal of recent interest in the development of new alternatives in this particular field.

During the last few decades a number of devices have been proposed. However, the only significant contribution has been in the field of very high-voltage circuits, with the introduction of transformers based on condensers together with an auxiliary, inductive transformer. However, these transformers are not the ideal alternative as they are bulky and expensive, while they are not particularly precise.

Undoubtedly, the most promising current line of investigation is centered in the area of fiber optics, both active and passive.

As fiber optics are made of dielectric materials which can transmit light energy, they make highly efficient, galvanic separation of the circuits possible. At the same time, dielectric materials are also capable of transmitting another type of energy: mechanical energy.

One obvious solution to the present problems in this field, would be to use one or several transformers which, being more stable than devices based on fiber optics, would nevertheless have the same advantages as fiber optics with respect to the simplicity of the associated electronic circuits. To date, no such idoneous alternative is known to exist.

DESCRIPTION OF THE INVENTION

Transformers for voltage meters based on mechanical waves, of the type proposed in this report, are an obvious novelty in their field. They consist in a transmitter, a receiver, a dielectric body and a mechanical connection. The transmitter converts the voltage variations in elastic waves; these waves flow through the dielectric body to the receiver by means of the mechanical connection. The receiver then converts the mechanical waves in electric signals which are then amplified by an electronic unit.

To generate elastic waves from electric fields, and in order to produce electric waves from elastic waves, piezoelectric or electrostrictive materials are used.

Depending on the structure, it is possible to build four different types of transformers based on mechanical waves: monolithic (one-piece) devices, self-connecting devices, directly-connecting devices and devices which are connected externally.

More specifically, in transformers of the type described by this invention, variations in voltage in the primary circuit generate elastic waves and these variations in mechanical power (compression and expansion of materials) reach the secondary circuit where they are converted again into voltage variations.

The most appropriate components for generating these elastic waves, considering the fact that they are resistant to high electric fields, are made up of dielectric materials with relatively high conversion quotients, based on piezoelectric materials (glass, porcelain, polymers and "composites") and on electrostrictive materials. These materials are known for their capacity to contract or expand under the application of an electric field.

Inversely, when mechanical forces of compression or stretching are applied to piezoelectric materials, electric tension is generated between the two sides of the material, making such materials suitable for use in the receiver elements of the secondary circuit.

In general terms, the transformer described by this invention is made up of the following parts:

Transmitter.

Receiver.

A dielectric body which serves for the galvanic separation of the circuits.

A connection apparatus.

The transmitter converts the electric waves in mechanical waves which, aided by the connection apparatus, flow through the dielectric body to the receiver. The receiver converts the mechanical waves in electric waves.

The connection structure and the dielectric body can constitute the same element, performing both functions.

The ratio between the primary and secondary voltages depends on the following factors:

Mechanical and electrical characteristics of the materials used in the transmitter and the receiver.

Their relative size.

Ratio between transmitter/receiver deformations which are actually accomplished through the connection structure.

Alternatively, it could be necessary to use an electronic unit to amplify the receiver signal, since it is a low-powered signal. Moreover, this unit is responsible for the transformation ratio which is the result of the thermal derivatives and is what makes precise measuring possible in this device.

DESCRIPTION OF THE DRAWINGS

An integral part of this report includes two pages of illustrations which are meant to further complement the written description, expanding on the characteristics of the invention as follows:

Figure number 1. This is a block diagram of the different elements which work together in harmony in this invention, to fulfill the requirements of transformers of electric voltage meters based on mechanical waves.

Figure 1:
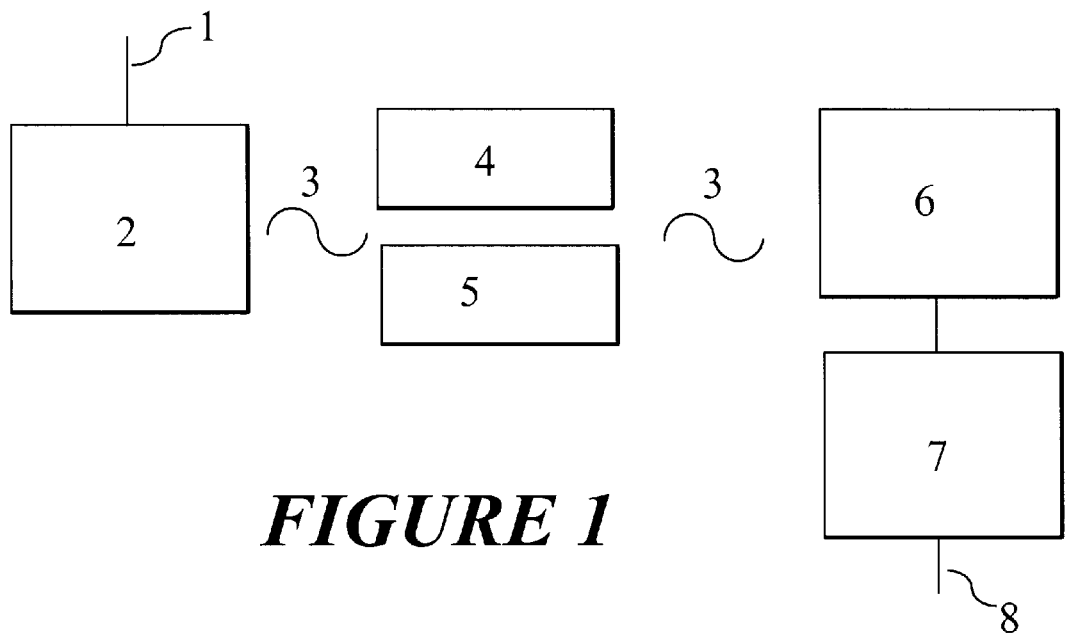
Figure 2:
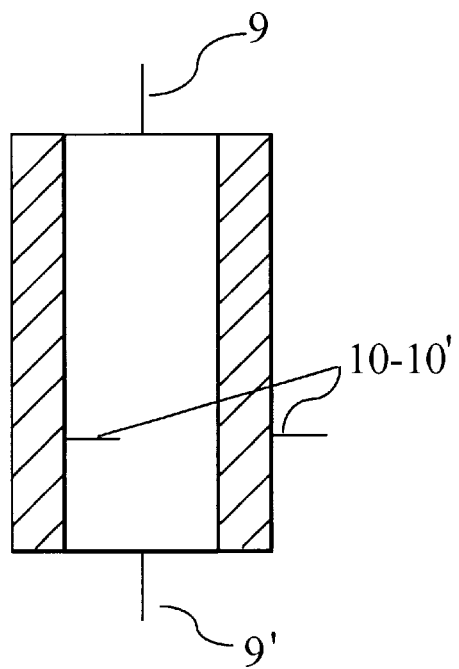
Figure 3:
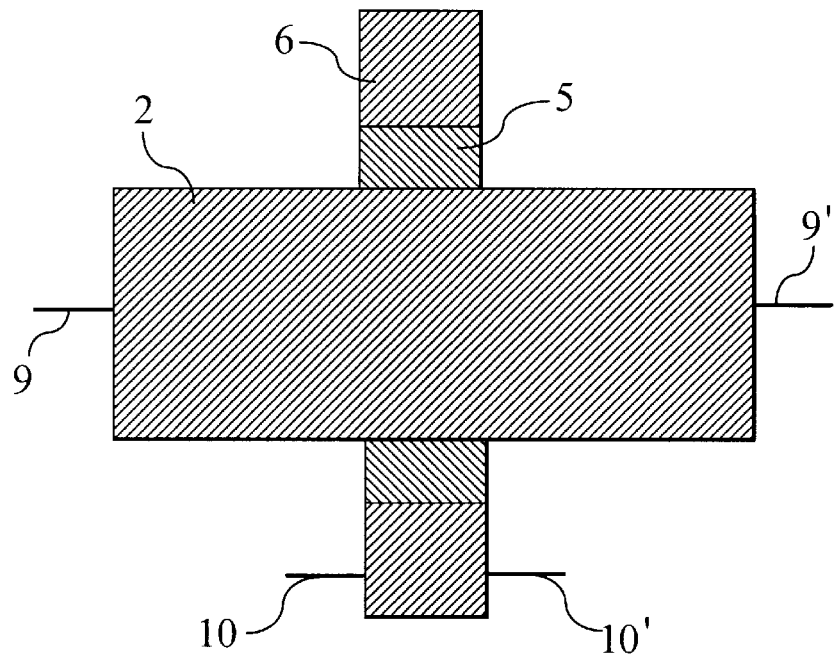
Figure 4:
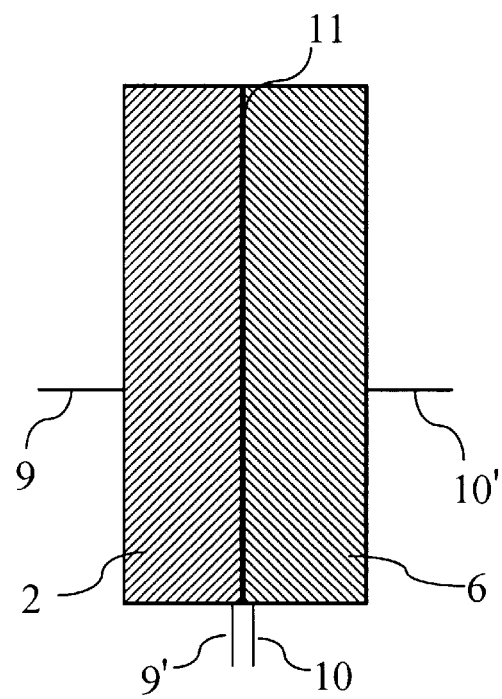
Figure 5:
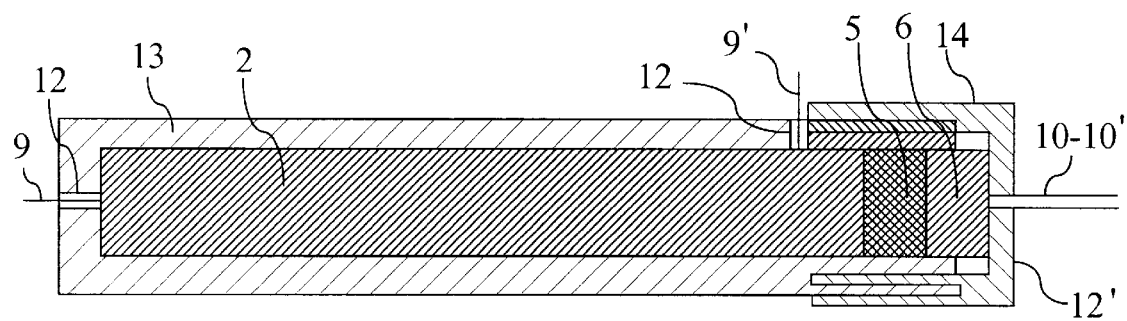

Figure number two. This is a sectioned, overhead, lateral view of a monolithic (one-piece) transformer.

Figure number three. This is a second form of the invention which contemplates an example of a selfconnecting transformer.

Figure number four. This is the invention contemplated as a directly-connected transformer.

Figure number five. Finally, in its fourth form, the transformer is contemplated with an external connection.

PREFERRED FORMS OF THE INVENTION

Figure number 1 shows that the transformer for voltage meters, based on mechanical waves, is made up of a transmitter (2), a receiver (6), a dielectric body for galvanic separation of the circuits (5) and a connection apparatus (4).

The transmitter (2) converts the electric waves (1) in mechanical waves (3), which by means of the connection apparatus (4) are propagated through the dielectric body (5) to the receiver (6), and this receiver (6) converts the mechanical waves (3) in electric waves (8).

The connection apparatus (4) and the dielectric body (5) can constitute the same unit which carries out both functions.

The ratio between primary and secondary voltage depends on the mechanical and electrical characteristics of the materials used in the transmitter (2) and the receiver (6), as well as on their relative dimensions and on the ratio between transmitter (2) and receiver (6) deformations which are actually accomplished by the connection apparatus (4).

An optional, electronic unit (7) might be required in order to amplify the receiver signal (6), as this is a low-power signal.

It should be pointed out that the above mentioned electronic unit (7) is responsible for compensating the variations in the transformation ratio which are the result of thermal derivatives and permits precise measurement in the case of this invention.

In one of its basic forms, the transformer for voltage meters, based on mechanical waves, can be monolithic (one-piece, for example in the shape of a parallelopipedon). In this version, the transmitter (2), the connection apparatus (4), the dielectric body (5) and the receiver (6) are all integrated in the same structure made of piezoelectric material.

The primary circuit, transmitter electrodes (9) and (9'), are located on two sides of the parallelopipedon, while the receiver electrodes (10) and (10'), or secondary circuit, are on the other two sides.

The direction of polarization should be such that if an alternating wave to the primary electrodes is applied, an alternating wave to the secondary electrodes is generated.

Another constructive example of this kind of transformer is a tube or empty cylinder.

The transmitter (2) electrodes (9) and (9') are located in the upper and lower sections of the tube, while the receiver (6) electrodes (10) and (10') are located on the interior and exterior surface of the tube.

These transformers have the advantage of being structurally simple and very compact, however they do not characteristically generate uniform distribution of the electric field in piezoelectric bodies.

Figure number 2 is an illustration of a transformer for electric voltage meters based on mechanical waves, in its monolithic (one-piece) form. transformer for electric voltage meters based on mechanical waves of the self-connecting type, where the shape of the transmitter (2) and the receiver (6) allow for direct transmission of the elastic waves between both elements. For example, the transmitter (2) is a cylinder and the receiver (6) is a ring.

The transmitter (2) fits into the receiver (6) and if the exterior diameter of the cylinder (2) is slightly greater than the interior diameter of the ring (6) the resulting structure is completely rigid and increases or decreases in the diameter of the cylinder will result in expansion or contraction of the ring (6).

In this version of the invention, if there were a dielectric body, it would be in the form of another ring fitted between the transmitter (2) and the receiver (6).

Figure number 4 illustrates a third version of the invention: a directly-connected transformer of electric voltage meters based on mechanical waves. In this version the receiver (6) is directly connected to the transmitter (2) by means of the dielectric body (5) which serves as both connection apparatus and union (with no reference to the dielectric body in Figure number 4).

For the purposes of illustration, Figure number 4 shows two discs of piezoelectric material with electrodes directly applied on both sides with adhesive compounds 11), in the shape of a simple transformer with a directly-connected structure.

One of the discs of piezoelectric material is the transmitter (2) and the other is the receiver (6), although it should be pointed out that the transmitter (2) could also be made of electrostrictive material in order to withstand high, inverse fields without risk of depolarization.

If the discs (2) and (6) are thick, the preferred vibration mode will be longitudinal and the forces transmitted from the transmitter (2) to the receiver (6) will be the result of inertial force.

If one side of the receiver (6) were attached to a fixed surface, the center of gravity of the transmitter (2) would move alternately as a result of the effect of the electric fields.

In another case, if one side of the transmitter (2) were fixed, expansion and contraction of it would move the receiver (6) and in turn the mass, which could be added to the receiver in order to increase the energy involved.

If, on the other hand, the discs (2) and (6) are thin, of very slight thickness relative to their diameter, the force of flexion would predominate over inertia, and the preferred vibration mode of the discs would be radial and the transmitter would oscillate between concave and convex forms, alternately flexing the receiver.

In Figure number 4, references (9) and (9') represent the transmitter (2) electrodes, while references (10) and (10') represent the receiver (6) electrodes.

Figure number 5 illustrates a fourth form of the invention, in this case an externally-connected transformer. A differentiated structure accomplishes the connection between the transmitter (2) and the receiver (6); for example, the connection apparatus is a tube and the transmitter (2) and the receiver (6) are discs or cylinders which are inserted in the tube (13), and at the same time it carries the dielectric body (5).

The tube (13) is closed on both ends, however one of the ends has a moveable closing device or cover (14).

More specifically, this closing device (14) is illustrated as a screw-on top making it possible to alter the pressure on the inside so that by tightening this cover (14), the pressure on the transmitter (2) and the receiver (6) is increased.

The adjusted pressure should be such that when the transformer is in use, there is never a total loss of pressure when the active, interior elements are at maximum contraction. This kind of union is accomplished by subjection to initial pressure.

Another type of union can be accomplished between the active elements (direct connection) plus rigid attachments to the external connection structure (13), so that expansion in the transmitter (2) causes contraction in the receiver (6) and contraction in the transmitter (2) cause expansion in the receiver (6) with no need for initial pressure.

The external structures which completely enclose the active elements, as in the case of the closed tube (13), should have openings (12) for the wires to run to the transmitter (2) electrodes (9) and (9') and to the receiver (6) electrodes (10) and (10').

The externally-connected transformer is the most complex mechanically, however it is the one which can best generate the strongest secondary circuit signals. This means that although transformers of the type herein illustrated can be used in a wide range of frequencies and tensions, their most important field of application is to be found in the area of generating, transporting and distributing electric energy where high tensions are handled, and there is a need for strict galvanic insulation together with high levels of accuracy in measurement.

When this invention is used as an instrument of measurement, the materials which are utilized must have high thermal stability, a long life, and high linearity. Deviation caused by temperature variance can be further reduced by choosing materials for the transmitter (2) and the receiver (6) which have thermal coefficients of opposing polarity.

In this type of transformers the transmitters (2) tend to be much larger than the receivers (6), particularly in the case of high voltage meters. In order to reduce the size, the transmitters can be built with materials which permit high electric fields without becoming old nor risking depolarization; especially in the latter case, it should be kept in mind that electrostrictive materials offer distinct advantages.

If the transmitter (2) is too large to be built in one piece, it can be built using discs or empty cylinders, piled one on top of the other and attached to one another so that each disc or elementary cylinder will only have to withstand a fraction of the total pressure applied to the primary circuit.

One of the advantages of these transformers is that they offer the possibility of simple electric insulation at low production costs, since the primary and secondary circuits consist in simple electrodes rather than turns in coils.

Furthermore, as the transmitters (2) are made of nonconducting materials, there is no need for the dielectric body which accomplishes the galvanic insulation in transformers of single-phase meters. In such transformers, one of the transmitter (2) electrodes would be connected to one of the phases and the other would be grounded and this electrode would make contact with one from the receiver (6), which would also be grounded; even if both groundings were to fail, there would still be no shock hazard due to the very low conductivity of the transmitter.

At this point, this description should be sufficiently detailed so that any expert in the field will understand the full impact of the invention and the advantages which it offers.

The materials, shape, size and form of the different elements can be changed as long as the essence of the invention is not altered. The terms used in this report are not meant to limit their wider interpretation.

We claim:

1. An isolation transformer for transforming a primary voltage in a primary alternating-current electric circuit to a secondary voltage in a secondary alternating-current electric circuit, so that a measurement of the primary voltage may be obtained by measuring the secondary voltage, comprising:

a transmitter having input electrodes connected to the primary circuit, said transmitter being capable of converting electrical energy received from said input electrodes into mechanical energy;

a receiver having output electrodes connected to the secondary circuit receiver being discrete from said transmitter, being in mechanical communication with and being capable of converting mechanical energy received from the transmitter into electrical energy at said output electrodes;

a dielectric body disposed between said transmitter and receiver for electrically isolating the transmitter from the receiver;

a tube shaped connection apparatus having an open end and containing said transmitter, said dielectric body and said receiver, said connection apparatus being capable of transferring mechanical energy from said transmitter to said receiver; and an end cap removably connected to said open end of said connection apparatus to thereby form an enclosure for said transmitter, said receiver and said dielectric body.

2. The transformer of claim 1 further comprising an amplifying unit connected to said output electrodes, said amplifying unit being capable of amplifying electrical energy.

3. The transformer of claim 1 wherein one side of said transmitter is fixed to some other structure.

4. The transformer of claim 1 wherein the end cap is moveable to selectively vary the size of the enclosure in order to adjust the force applied to said transmitter and receiver.

5. The transformer of claim 1 wherein said cap means is capable of threaded engagement with said connection structure.

6. The transformer of claim 5 wherein said cap means is capable of threaded engagement with said connection structure.

7. The transformer of claim 1, wherein said enclosure is adapted to allow said electrodes to pass therethrough.

8. The transformer of claim 1, wherein said transmitter, said receiver, and said dielectric body are tightly packed within said enclosure so that said enclosure simultaneously applies a force on said transmitter and said receiver.

9. The transformer of claim 1, wherein said transmitter, said receiver and said dielectric body are positioned along the longitudinal axis of the tube.

\* \* \* \* \*